(12) United States Patent
Wang

(10) Patent No.: US 12,136,568 B2
(45) Date of Patent: Nov. 5, 2024

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 332 days.

(21) Appl. No.: 17/648,964

(22) Filed: Jan. 26, 2022

(65) Prior Publication Data

US 2022/0319923 A1 Oct. 6, 2022

Related U.S. Application Data

(63) Continuation of application No. PCT/CN2021/109155, filed on Jul. 29, 2021.

(30) Foreign Application Priority Data

Apr. 1, 2021 (CN) .......................... 202110357903.5

(51) Int. Cl.
*H01L 23/48* (2006.01)
*H01L 21/768* (2006.01)

(52) U.S. Cl.
CPC .... *H01L 21/76898* (2013.01); *H01L 21/7682* (2013.01); *H01L 23/481* (2013.01)

(58) Field of Classification Search
CPC ..... H01L 23/48; H01L 23/481; H01L 23/367; H01L 23/538; H01L 23/5384; H01L 21/768; H01L 21/7682; H01L 21/76897; H01L 21/76847; H01L 21/76898; H01L 29/515; H01L 29/4991

USPC ......................................................... 257/621
See application file for complete search history.

(56) References Cited

U.S. PATENT DOCUMENTS

| | | | |
|---|---|---|---|
| 5,753,948 A | 5/1998 | Nguyen | |
| 8,877,559 B2 | 11/2014 | Gao | |
| 9,024,390 B2 | 5/2015 | Miyajima | |
| 9,245,799 B2 | 1/2016 | Barth | |
| 10,049,932 B2 | 8/2018 | Barth | |
| 10,847,442 B2 | 11/2020 | Li | |
| 2007/0152349 A1* | 7/2007 | Chung | H01L 23/481 257/786 |
| 2012/0217611 A1* | 8/2012 | Liu | H01L 23/481 257/508 |

(Continued)

FOREIGN PATENT DOCUMENTS

| | | |
|---|---|---|
| CN | 103456714 A | 12/2013 |
| CN | 104011848 A | 8/2014 |

(Continued)

*Primary Examiner* — Chuong A Luu
(74) *Attorney, Agent, or Firm* — Syncoda LLC; Feng Ma

(57) ABSTRACT

A semiconductor structure includes: a base including a substrate and a dielectric layer, herein the substrate having a front surface and a back surface that are oppositely arranged, and the dielectric layer is located on the front surface; a connecting hole penetrating the substrate and extending to the dielectric layer; a connecting structure, located in the connecting hole; and an insulating structure, located between the connecting structure and the inner wall of the connecting hole. The insulating structure, the inner wall of the connecting hole, and the connecting structure define an air gap.

18 Claims, 16 Drawing Sheets

(56) References Cited

U.S. PATENT DOCUMENTS

| | | |
|---|---|---|
| 2013/0320554 A1 | 12/2013 | Barth |
| 2013/0320562 A1 | 12/2013 | Miyajima |
| 2014/0264921 A1* | 9/2014 | Gao .................. H01L 23/481 |
| | | 257/774 |
| 2015/0243583 A1 | 8/2015 | Li et al. |
| 2016/0071766 A1 | 3/2016 | Barth |
| 2017/0200645 A1 | 7/2017 | Barth |

FOREIGN PATENT DOCUMENTS

| | | |
|---|---|---|
| CN | 102651355 B | 10/2015 |
| CN | 110504284 A | 11/2019 |

* cited by examiner

SEMICONDUCTOR STRUCTURE AND METHOD FOR FORMING SAME

CROSS-REFERENCE TO RELATED APPLICATIONS

This is a continuation of International Application No. PCT/CN2021/109155 filed on Jul. 29, 2021, which claims priority to Chinese Patent Application No. 202110357903.5 filed on Apr. 1, 2021. The disclosures of the above-referenced applications are hereby incorporated by reference in their entirety.

BACKGROUND

A through-silicon via (TSV) technology is a technical solution for interconnecting stacked chips in three-dimensional integrated circuits. Chips can be effectively stacked in three-dimensional directions, to manufacture electronic devices with a more complex structure, better performance, and higher cost effectiveness. Therefore, the TSV technology becomes the most notable technology among electronic packaging technologies at present.

SUMMARY

This disclosure relates to the field of integrated circuit technologies, and in particular to a semiconductor structure and a method for forming the same.

According to various embodiments of this disclosure, a semiconductor structure and a method for forming the semiconductor structure are provided.

A semiconductor structure includes: a base, including a substrate and a dielectric layer, in which the substrate has a front surface and a back surface that are oppositely arranged, and the dielectric layer is located on the front surface; a connecting hole, penetrating the substrate and extending to the dielectric layer; a connecting structure, located in the connecting hole; and an insulating structure, located between the connecting structure and the inner wall of the connecting hole, in which the insulating structure, the inner wall of the connecting hole, and the connecting structure define an air gap.

A method for forming a semiconductor structure includes: providing a base including a substrate and a dielectric layer, in which the substrate has a front surface and a back surface that are oppositely arranged, and the dielectric layer is formed on the front surface; forming a connecting hole in the base, in which connecting hole the penetrates the substrate and extends to the dielectric layer; forming a connecting structure in the connecting hole; and forming an insulating structure between the connecting structure and the inner wall of the connecting hole, in which the insulating structure, the inner wall of the connecting hole, and the connecting structure define an air gap.

A stacked structure is formed by processing any one of the foregoing semiconductor structure.

BRIEF DESCRIPTION OF THE DRAWINGS

To describe the technical solutions in the embodiments of this disclosure and the related art more clearly, the following will briefly introduce the accompanying drawings required for describing the embodiments and the related art. Apparently, the accompanying drawings in the following description show merely some embodiments of this disclosure, and a person of ordinary skill in the art may still derive other drawings from these accompanying drawings without creative efforts.

DETAILED DESCRIPTION

Figure 1:
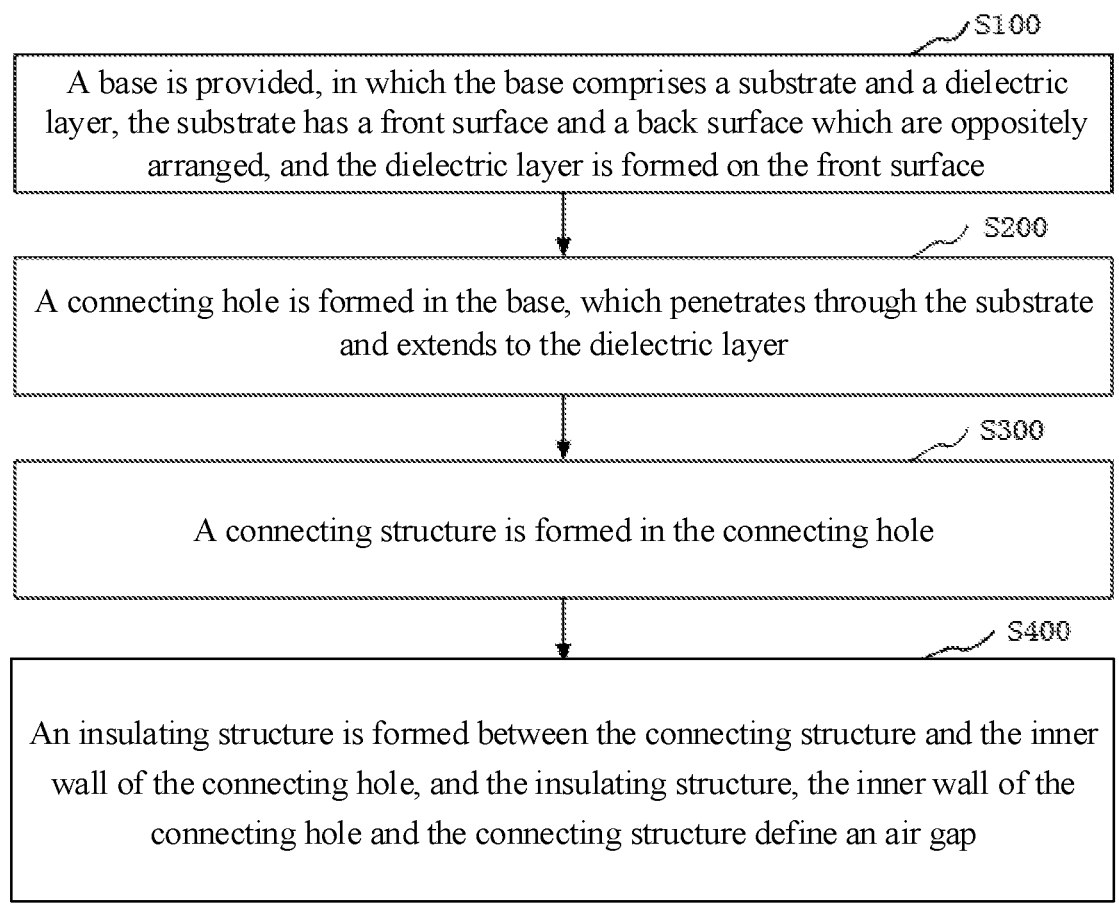
FIG. 1 is a flowchart of a method for forming a semiconductor structure according to an embodiment.

For the ease of understanding of this disclosure, this disclosure is described more completely below with reference to the accompanying drawings. The embodiments of this disclosure are given in the accompanying drawings. However, this disclosure may be implemented in various forms, and is not limited to the embodiments described herein. On the contrary, these embodiments are provided so that the disclosed content of this application will be more thorough and complete.

Unless otherwise defined, all technical terms and scientific terms used herein have the same meaning as how they are generally understood by a person skilled in the art to which this disclosure pertains. The terms used herein in the specification of this disclosure are merely used for describing specific embodiments, but are not intended to limit this disclosure.

It should be understood that when an element or layer is referred to as being "on", "adjacent to", "connected to", or "coupled to" another element or layer, it can be directly on, adjacent to, connected to, or coupled to another element or layer, or an interject element or layer may be present. In contrast, when an element is referred to as being "directly on", "directly adjacent to", "directly connected to", or "directly coupled to" another element or layer, no interject element or layer is present. It should be understood that, although the terms "first", "second", "third" etc. may be used to describe various elements, components, regions, layers, doping types and/or sections, these elements, components, regions, layers, doping types and/or sections should not be limited by these terms. These terms are only used to distinguish an element, component, region, layer, doping type or section from another element, component, region, layer, doping type or section. Therefore, a first element, component, region, layer, doping type or section discussed below could be termed a second element, component, region, layer or section without departing from the teachings of this disclosure.

Spatially relative terms, such as "below", "under", "lower", "beneath", "above", "upper", and the like, may be used herein to describe the relationship between an element or feature to another element(s) or feature(s) as shown in the figures. It should be understood that the spatial-relationship terms also include different orientations of devices in use or operation in addition to the orientations depicted in the figures. For example, if the device in the figures is turned over, elements or features described as "under", "beneath" or "below" other elements or features would then be oriented "on" another elements or features. Therefore, the exemplary term "below" and "under" can include both orientations of on and below. In addition, the device may also include other orientation (for example, rotated 90 degrees or at another orientation) and the spatially relative descriptors used herein should be interpreted accordingly.

As used herein, the singular forms "a," "an", and "the/said" are intended to include the plural forms as well, unless the context clearly indicates otherwise. It should be further understood that the terms such as "include/comprise" and/or "have" specify the presence of said features, integers, operations, operations, components, sections, or combinations thereof, but do not preclude the possibility of the presence or addition of one or more other features, integers, operations, operations, components, sections, or combinations thereof. In addition, the term "and/or" in this specification includes any or all combinations of two or more of the associated listed items.

The embodiments of this disclosure are described herein with reference to cross-section views of structures in desired embodiments (or intermediate structures) of this disclosure. Therefore, shape changes caused by, for example, manufacturing technologies and/or tolerances can be expected. Therefore, the embodiments of this disclosure should not be limited to specific shapes of the areas shown herein, but also include, for example, shape deviations caused by manufacturing technologies.

TSV structures have significant problems in heat dissipation capability and influence on peripheral devices.

In an embodiment, referring to FIG. 1, a method for forming a semiconductor structure is provided, including the following operations.

Figure 4:
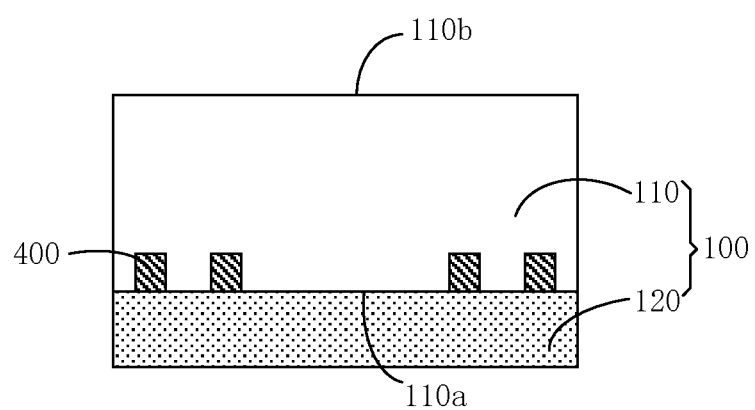
FIG. 4 is a first schematic structural diagram in a process of forming a semiconductor structure.

At S100, a base 100 including a substrate 110 and a dielectric layer 120 is provided, the substrate 110 has a front surface 110a and a back surface 110b that are oppositely arranged, and the dielectric layer 120 is provided on the front surface 110a, referring to FIG. 4.

Figure 5:
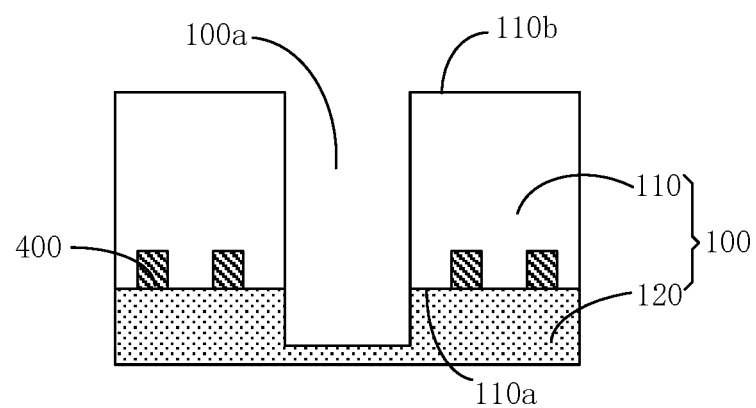
FIG. 5 is a second schematic structural diagram in a process of forming a semiconductor structure.

At S200, a connecting hole 100a is formed in the base 100, and the connecting hole 100a penetrates the substrate 110 and extends to the dielectric layer 120, referring to FIG. 5.

Figure 10:
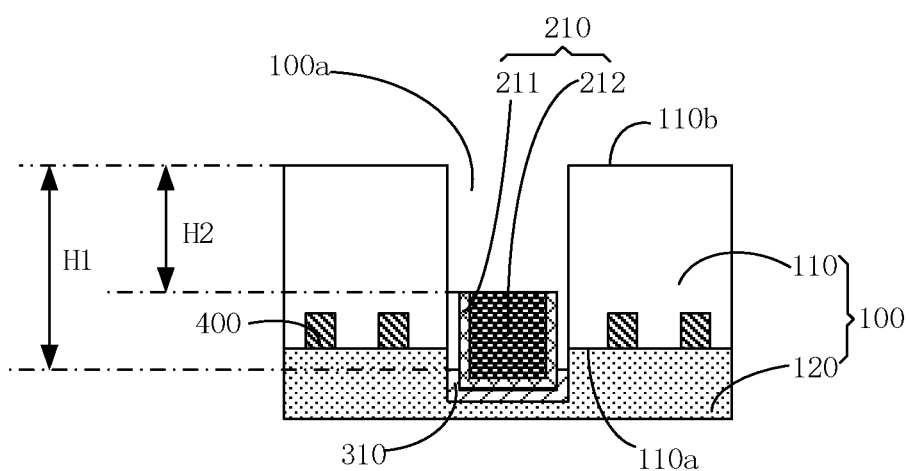
FIG. 10 is a seventh schematic structural diagram in a process of forming a semiconductor structure.
Figure 14:
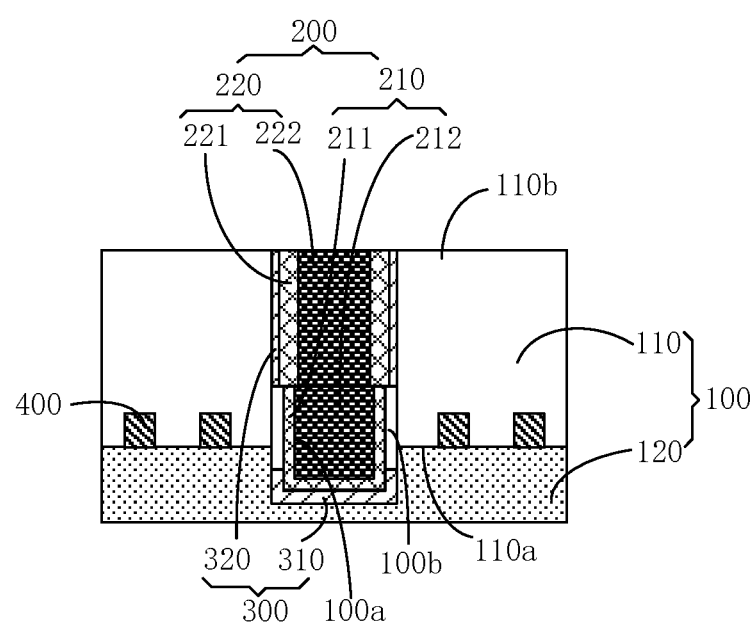
FIG. 14 is a second schematic diagram of semiconductor structures according to different embodiments.

At S300, a connecting structure 200 is formed in the connecting hole 100a, the connecting structure 200 is spaced apart from an inner wall of the connecting hole 100a, referring to FIG. 10 and FIG. 14.

Figure 11:
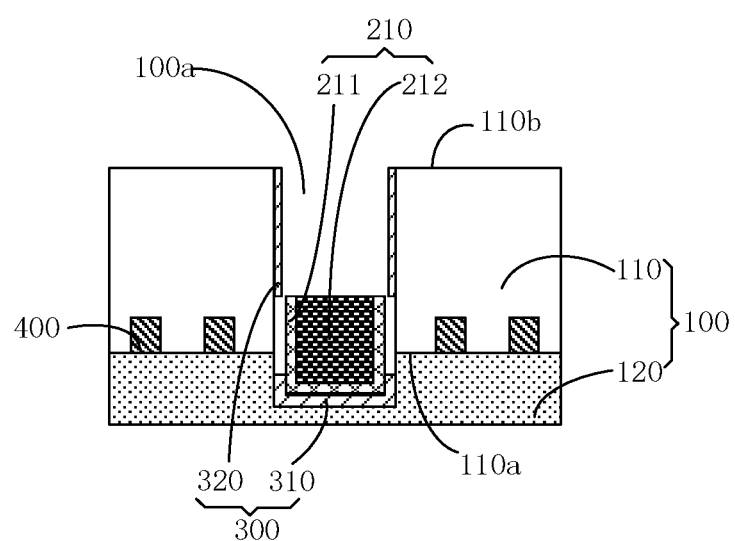
FIG. 11 is an eighth schematic structural diagram in a process of forming a semiconductor structure.

At S400, an insulating structure 300 is formed between the connecting structure 200 and the inner wall of the connecting hole 100a, referring to FIG. 11 and FIG. 14.

Herein, the insulating structure 300, the inner wall of the connecting hole 100a, and the connecting structure 200 define an air gap, referring to FIG. 14.

At S100, the substrate 110 may include, but is not limited to, a silicon substrate. Shallow trench isolation structures 400 may be formed on the side, closing to the dielectric layer 120, of the substrate 110. The shallow trench isolation structures 400 isolate the substrate 110 into a plurality of active areas. The active areas are used for forming various semiconductor devices.

The dielectric layer 120 may include, but is not limited to, an oxide (for example, silicon dioxide etc.) dielectric layer. An interconnecting hole structure and a metal layer electrically connected to the active areas may be formed in the dielectric layer 120, to lead out signals from the semiconductor devices or provide external signals to the semiconductor devices.

At S200, the connecting hole 100a is for forming the connecting structure 200 in it. When a plurality of chips including the semiconductor structures are stacked, corresponding connecting holes 100a of respective chips are aligned, so that the connecting structures 200 in the connecting holes 100a are electrically connected, to interconnect the chips.

At S300, the connecting structure 200 is a structure for conductive connecting, and may include a plurality of film layers. Certainly, the connecting structure 200 may optionally include only one film layer. This disclosure is not limited thereto.

When implementing conductive connecting between the chips, the connecting structures 200 will generate a large amount of heat, which may affect the performance of chips.

In addition, after generating the heat, the connecting structures 200 may expand or contract due to thermal stress. If a connecting structure 200 is in contact with the substrate 110 and/or the dielectric layer 120 by the insulating structure, the substrate 110 and/or the dielectric layer 120 may deform due to the stress, which cause cracks at the contact interface, or even may affect the performance of semiconductor devices in the active areas.

At S400, the insulating structure 300 is located between the connecting structure 200 and the inner wall of the connecting hole 100a, to further implement electrical isolation between the connecting structure 200 and the substrate 110. The material of the insulating structure 300 may be silicon dioxide or the like. The material of the insulating structure 300 may be the same as or different from the material of the dielectric layer 120.

In this embodiment, the insulating structure 300, the inner wall of the connecting hole 100a, and the connecting structure 200 define the air gap 100b. The air gap 100b has the insulation property just as the insulating structure 300, so that the air gap 100b and the insulating structure 300 can together effectively realize the electrical isolation between the connecting structure 200 and the substrate 110.

In addition, in this case, because the air gap 100b existing between the connecting structure 200 and the inner wall of the connecting hole 100a and also because the air has a low thermal conductivity, the heat generated by the connecting structure 200 can be effectively prevented from dissipating to the semiconductor devices, the dielectric layer or the like around the connecting structure 200, thereby effectively improving the heat dissipation performance.

In addition, in this case, the air gap 100b can also effectively isolate the connecting structure 200 from the substrate 110 and/or the dielectric layer 120 around the connecting structure 200, thereby effectively preventing the substrate 110 and/or the dielectric layer 120 from stress deformation due to thermal expansion of the connecting structure 200, and effectively avoiding the interface cracking phenomenon in the substrate 110 and/or the dielectric layer 120.

In an embodiment, referring to FIG. 5, S200 includes: etching the base 100 from the back surface 110b of the substrate 110 to form the connecting hole 100a.

As an example, the substrate 110 and the dielectric layer 120 may be sequentially etched from the back surface 110b of the substrate 110 by using a dry etching process, to form the connecting hole 100a. The depth of the connecting hole 100a may be 20 μm to 150 μm. A depth by which the connecting hole 100a extends into the dielectric layer 120 may be 0.5 μm to 1 μm. The diameter of the connecting hole 100a may be 3 μm to 50 μm. The aspect ratio (that is, the ratio of depth to diameter) of the connecting hole 100a may be 0.4 to 50.

Because the back surface 110b of the substrate 110 is relatively far away from the semiconductor devices provided in the active areas and circuit structures connecting the semiconductor devices, this embodiment can effectively avoid damage to the semiconductor devices provided in the active areas and the related circuit structures during the formation of the connecting hole 100a.

In an embodiment, referring to FIG. 14, the air gap 100b formed at S400 penetrates the interface between the substrate 110 and the dielectric layer 120.

The interface between the substrate 110 and the dielectric layer 120 is prone to generating stress deformation due to thermal expansion of the connecting structure 200, thereby causing interface cracking.

In this embodiment, the air gap 100b penetrates the interface between the substrate 110 and the dielectric layer 120, to enable the air gap 100b to isolate the connecting structure 200 from the interface between the substrate 110 and the dielectric layer 120, thereby further effectively preventing interface cracking from generating at the interface between the substrate 110 and the dielectric layer 120.

In addition, there are dense semiconductor devices around the interface between the substrate 110 and the dielectric layer 120, and the structures of the semiconductor devices usually penetrate the interface between the substrate 110 and the dielectric layer 120.

The air gap 100b penetrates the interface between the substrate 110 and the dielectric layer 120, to enable the air gap 100b to isolate the connecting structure 200 from the substrate 110 and the dielectric layer 120 that are located at the two sides of the interface. Therefore, in this embodiment, effective thermal-insulation protection can further be provided for the semiconductor devices around the air gap 100b, and the performance of the semiconductor devices around the air gap 100b can be prevented from being influenced by stress deformation of the substrate 110 and/or the dielectric layer 120.

In addition, because the air has a relatively small dielectric constant, the formation of the air gap 100b can effectively avoid parasitic capacitance between the connecting structure 200, the insulating structure 300 and the semiconductor substrate 110. Therefore, in this embodiment, a signal of the connecting structure 200 can be effectively prevented from being coupled to the substrate 110, nearby semiconductor devices or other connecting structures 200, thereby avoiding a phenomenon such as distortion of related signals or generation of leakage currents.

In an embodiment, the height of the part, corresponding to the dielectric layer 120, of the air gap 100b is less than that of the other part, corresponding to the substrate 110, of the air gap 100b.

The dielectric layer 120 is a film layer formed on the substrate 110. The thickness of the dielectric layer 120 is much less than that of the substrate 110. Therefore, in this embodiment, the height of the part of the air gap 100b corresponding to the dielectric layer 120 is set to be relatively small, so that the structure of the dielectric layer 120 can be effectively prevented from becoming unstable due to the air gap 100b.

In addition, a relatively large amount of heat is generated in the dielectric layer 120. In this case, the height of the part of the air gap 100b corresponding to the substrate 110 is set relatively large, so that the heat flows to the position with a large gap, to better facilitate heat dissipation, thereby further protecting nearby devices from influence.

Figure 2:
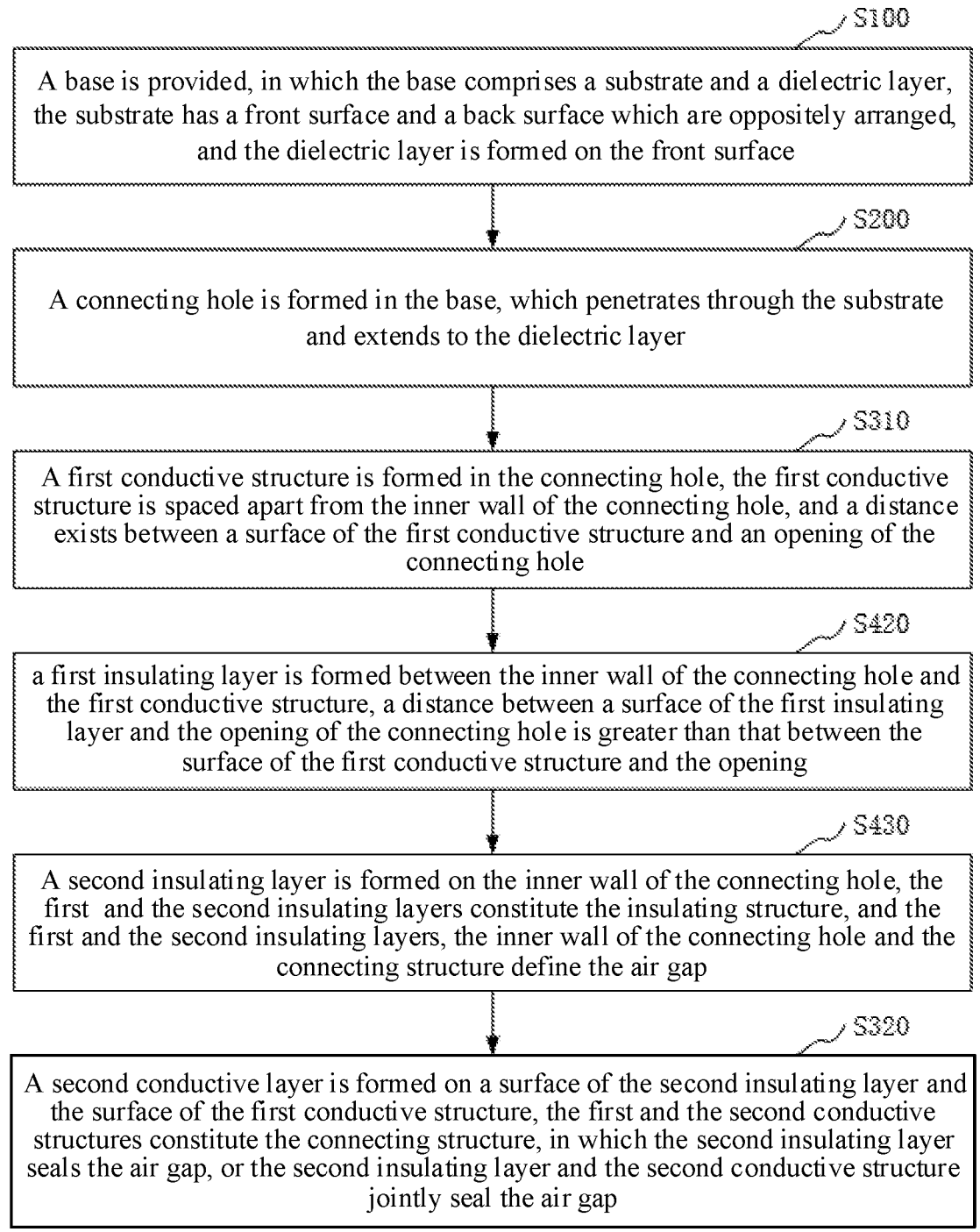
FIG. 2 is a flowchart of a method for forming a semiconductor structure according to another embodiment.

In an embodiment, referring to FIG. 2, S300 includes the following operation.

Figure 9:
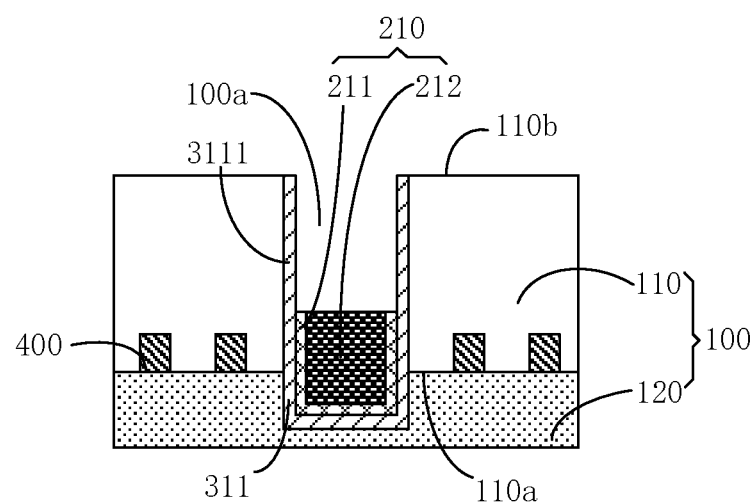
FIG. 9 is a sixth schematic structural diagram in a process of forming a semiconductor structure.

At S310, a first conductive structure 210 is formed in the connecting hole 100a, and the first conductive structure 210 is spaced apart from the inner wall of the connecting hole 100a, and there is a distance between a surface of the first conductive structure 210 and the opening of the connecting hole 100a, referring to FIG. 9.

S400 includes the following operations.

At S420, a first insulating layer 310 is formed between the inner wall of the connecting hole 100a and the first conductive structure 210, herein the distance H1 between the surface of the first insulating layer 310 and the opening of the connecting hole 100a is greater than the distance H2 between the surface of the first conductive structure 210 and the opening of the connecting hole 100a, referring to FIG. 10.

At S430, a second insulating layer 320 is formed on the inner wall of the connecting hole 100a, in which the first insulating layer 310 and the second insulating layer 320 form the insulating structure 300, and the first insulating layer 310, the second insulating layer 320, the inner wall of the connecting hole 100a, and the connecting structure 200 define the air gap, referring to FIG. 11.

S300 further includes the following operation.

At S320, a second conductive structure 220 is formed on the surface of the second insulating layer 320 and the surface of the first conductive structure 210, in which the first conductive structure 210 and the second conductive structure 220 form the connecting structure 200, referring to FIG. 14.

Figure 16:
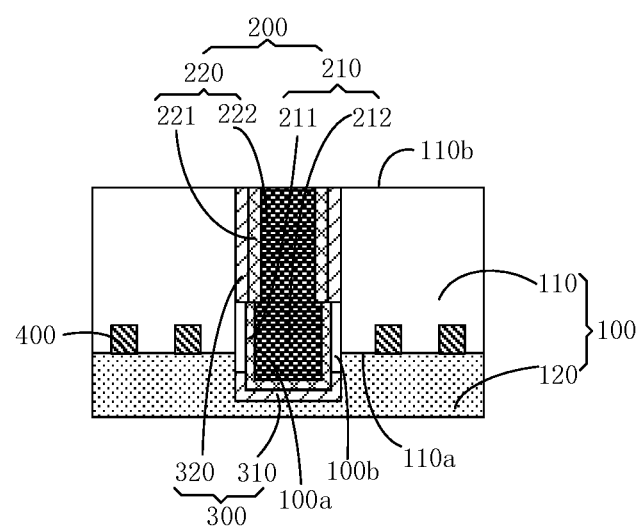
FIG. 16 is a fourth schematic diagram of semiconductor structures according to different embodiments.

The second insulating layer 320 seals the air gap 100b (referring to FIG. 16), or the second insulating layer 320 and the second conductive structure 220 jointly seal the air gap 100b (referring to FIG. 14).

In this embodiment, the connecting structure 200 is divided into the first conductive structure 210 and the second conductive structure 220, and the insulating structure 300 is divided into the first insulating layer 310 and the second insulating layer 320. The first conductive structure 210 is formed firstly, and the first insulating layer 310, the second insulating layer 320, and the second conductive structure 220 are then sequentially formed, so that the air gap 100b is easier to be processed and formed.

Figure 3:
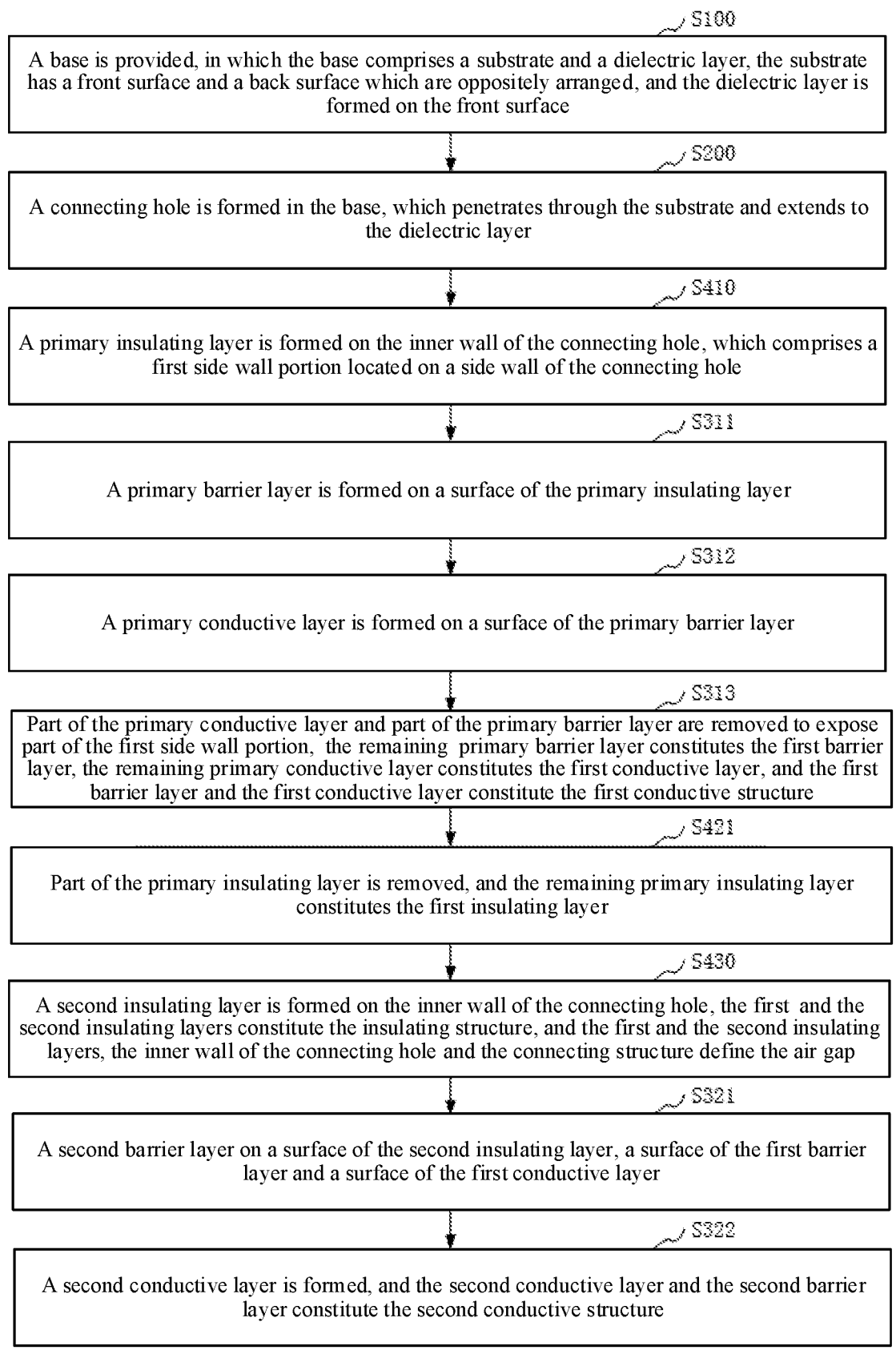
FIG. 3 is a flowchart of a method for forming a semiconductor structure according to yet another embodiment.

In an embodiment, specifically, referring to FIG. 3, S400 further includes the following operation.

Figure 6:
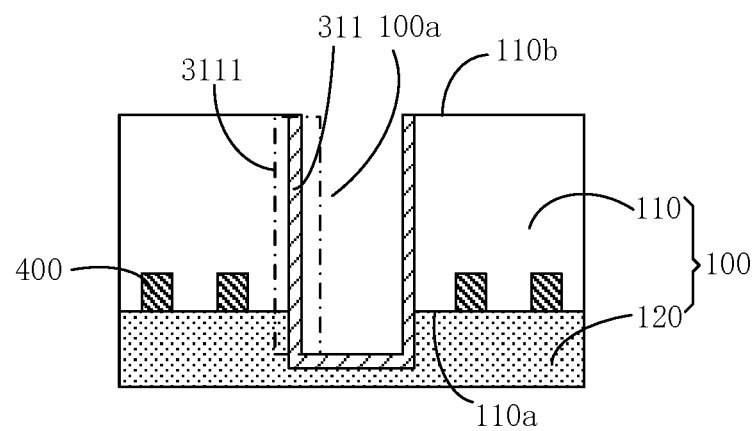
FIG. 6 is a third schematic structural diagram in a process of forming a semiconductor structure.

At S410, a primary insulating layer 311 is formed on the inner wall of the connecting hole 100a, herein the primary insulating layer 311 includes a first side wall portion 3111 located on the side wall of the connecting hole 100*a*, referring to FIG. 6.

S410 is performed before S310.

In this case, S310 includes the following operations.

Figure 7:
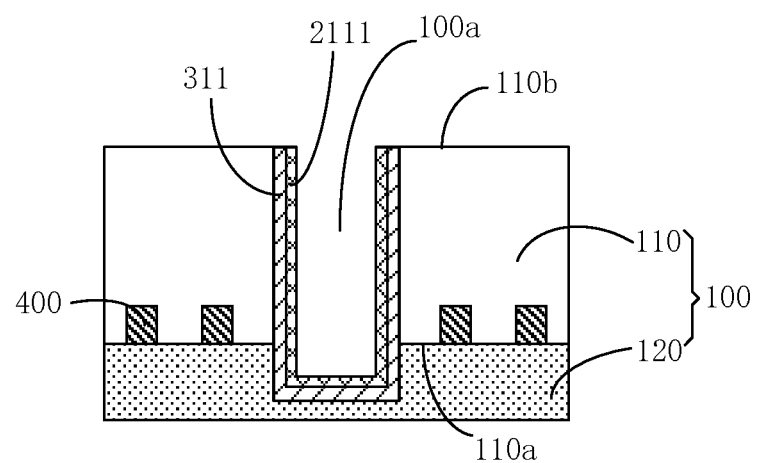
FIG. 7 is a fourth schematic structural diagram in a process of forming a semiconductor structure.

At S311, a primary barrier layer 2111 is formed on the surface of the primary insulating layer 311, referring to FIG. 7.

Figure 8:
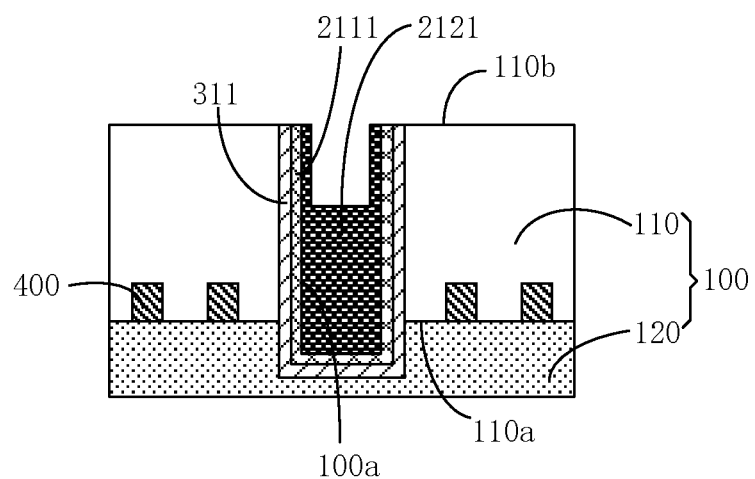
FIG. 8 is a fifth schematic structural diagram in a process of forming a semiconductor structure.

At S312, a primary conductive layer 2121 is formed on the surface of the primary barrier layer 2111, referring to FIG. 8.

At S313, part of the primary conductive layer 2121 and part of the primary barrier layer 2111 are removed, to expose part of the first side wall portion 3111. The remaining primary barrier layer 2111 forms a first barrier layer 211, the remaining primary conductive layer 2121 forms a first conductive layer 212, and the first barrier layer 211 and the first conductive layer 212 forms the first conductive structure 210, referring to FIG. 9.

Subsequently, S420 includes the following operations.

At S421, a part of the primary insulating layer 311 is removed. The remaining primary insulating layer 311 forms the first insulating layer 310, referring to FIG. 10.

Specifically, after the part of the primary insulating layer 311 is removed, the distance H1 between the surface of the first insulating layer 310 formed by the remaining primary insulating layer 311 and the opening of the connecting hole 100*a* is greater than the distance H2 between the surface of the first conductive structure 210 and the opening of the connecting hole 100*a*. That is, according to the direction in FIG. 10, after the part of the primary insulating layer 311 is removed, the surface of the first insulating layer 310 formed by the remaining primary insulating layer 311 is lower than the surface of the first conductive structure 210.

At S410, the material of the primary insulating layer 311 may be silicon dioxide or the like. Specifically, a silicon dioxide film layer may be deposited on the inner wall of the connecting hole 100*a* as the primary insulating layer 311 by using a chemical vapor deposition (CVD) process based on silane ($SiH_4$) or tetraethyl orthosilicate (TEOS). The thickness of the silicon dioxide film layer may be 0.2 μm to 2 μm.

At S311, the primary barrier layer 2111 may be formed by using a physical vapor deposition (PVD) process. The material of the primary barrier layer 2111 may be tantalum (Ta), tantalum nitride (TaN) or the like. The thickness of the primary barrier layer 2111 may be 0.05 μm to 0.1 μm.

At S312, the material of the primary conductive layer 2121 may be copper (Cu) or the like. Specifically, a copper seed layer may be firstly formed on the surface of the primary barrier layer 2111 by using a PVD process. Then, copper is grown on the surface of the copper seed layer by electroplating, and the copper seed layer and the electroplated copper together form the primary conductive layer 2121.

More specifically, part of the primary conductive layer 2121 further needs to be removed in subsequent S313 to form the air gap 100*b*. Therefore, at this time, the connecting hole 100*a* may not be filled up with the primary conductive layer 2121 grown on the surface of the primary barrier layer 2111. As an example, a filling thickness of the central part of the primary conductive layer 2121 may be 20% to 70% of the depth of the connecting hole 100*a*.

At S313, part of the primary barrier layer 2111 and part of the primary conductive layer 2121, which cover the first side wall portion 3111, may be removed by using a mixed acid solution, so that the first side wall portion 3111 of the primary insulating layer 311 is partially exposed, simultaneously the first barrier layer 211 and the first conductive layer 212 are formed.

The first barrier layer 211 can effectively avoid a stress influence caused by thermal expansion of the first conductive layer 212.

After the first side wall portion 3111 of the primary insulating layer 311 is partially exposed, S420 is then performed, making it easier to form the first insulating layer 310 with a surface lower than the surface of the first conductive structure 210, so that it is easier to obtain the air gap 100*b*.

At S420, the first side wall portion 3111 of the primary insulating layer 311 (for example, the silicon dioxide film layer) in the connecting hole 100*a* may be etched by using hydrofluoric acid or an dry etching process, to form the first insulating layer 310 connecting the first barrier layer 211.

S430 is performed after S420.

At S430, specifically, a second insulating material layer may be formed on the side wall of the connecting hole 100*a* and the surface of the first conductive structure 210 with a CVD process. Then, the second insulating material layer located outside the connecting hole 100*a* and on the surface of the first conductive structure 210 is removed, to form the second insulating layer 320.

The material of the second insulating layer 320 may be the same as or different from the material of the first insulating layer 310. This is not limited in this disclosure.

As an example, the thickness of the second insulating layer 320 formed in this operation may be greater than that of the first insulating layer 310. In this case, the air gap 100*b* may be sealed by the second insulating layer 320.

Certainly, the thickness of the second insulating layer 320 may be the same as that of the first insulating layer 310. Alternatively, the thickness of the second insulating layer 320 may be less than that of the first insulating layer 310. In this case, the second insulating layer 320 and the subsequently formed second conductive structure 220 may jointly seal the air gap 100*b*.

In an embodiment, S320 includes the following operations.

Figure 12:
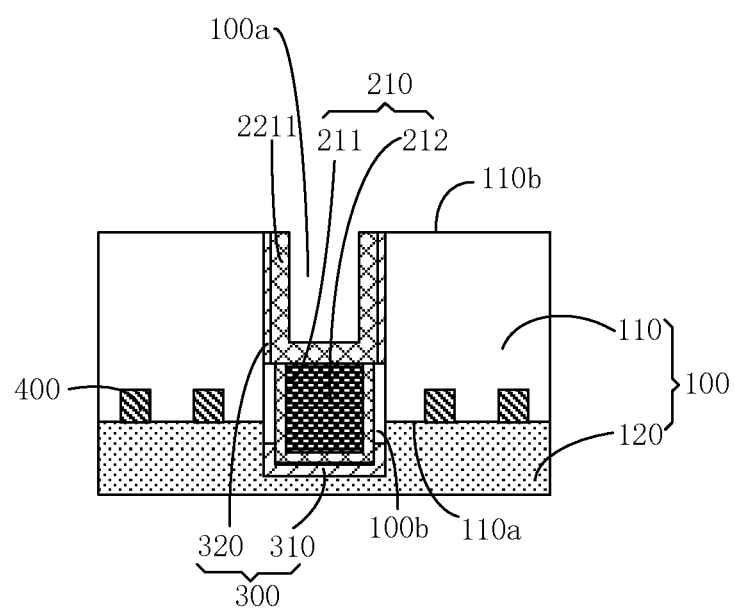
FIG. 12 is a ninth schematic structural diagram in a process of forming a semiconductor structure.

At S321, a second barrier base layer 2211 is formed on the surface of the second insulating layer 320, the surface of the first barrier layer 211, and the surface of the first conductive layer 212, referring to FIG. 12.

Figure 13:
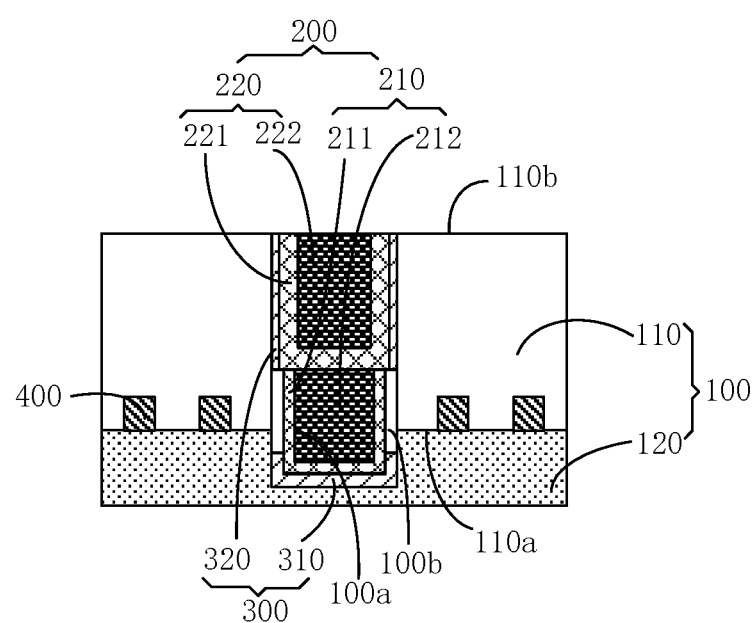
FIG. 13 is a first schematic diagram of semiconductor structures according to different embodiments.

At S322, a second conductive layer 222 is formed, which is connected to the second barrier layer 221, referring to FIG. 13 or FIG. 14.

At S321, the second barrier base layer 2211 may be formed by using a CVD process. The material of the second barrier base layer 2211 may be Ta, TaN or the like, and may be the same as or different from the material of the first barrier layer 211, which is also not limited in this disclosure.

The second barrier layer 221 is formed on the surface of the second insulating layer 320 and is connected to the second insulating layer 320, so that the stress influence caused by thermal expansion of the second conductive layer 222 can be effectively avoided.

In addition, in this embodiment, after S430, the surface of the first barrier layer 211 is exposed without being covered by the second insulating layer 320. Therefore, the second barrier base layer 2211 formed in this operation connects the first barrier layer 211.

At S322, the material of the second conductive layer 222 may be the same as or, of course, may be different from the material of the first conductive layer 212. This disclosure is not limited thereto.

As an example, when the material of the second conductive layer 222 and the first conductive layer 212 is copper, the process of forming the second conductive layer 222 may be similar to the process of forming the first conductive layer 212. In the process, a copper seed layer may be firstly formed, then copper is electroplated on the copper seed layer, and a further process is performed to form the second conductive layer 222.

In an embodiment, the second barrier base layer 2211 is used as the second barrier layer 221.

S322 includes: forming the second conductive layer 222 on the surface of the second barrier layer 221. The second conductive layer 222 and the second barrier layer 221 form the second conductive structure 220, referring to FIG. 13.

In this case, the connecting hole 100a is filled up by the second conductive layer 222. In addition, the second conductive layer 222 connects the second barrier layer 221, and is separated from the first conductive structure 210 by the second barrier layer 221.

That is, the second barrier layer 221 is provided between the second conductive layer 222 and the first conductive layer 212. Therefore, the second barrier layer 221 can effectively avoid cracking occurring at the interface of the second conductive layer 222 and the first conductive layer 212 due to thermal stress in the subsequent annealing process caused by the inconsistence of grain sizes or the like since the second conductive layer 222 and the first conductive layer 212 are formed separately.

Certainly, the form of the second conductive structure 220 may be different from that in this embodiment.

In another embodiment, S322 includes the following operations.

At S3221, at least a part of the second barrier base layer 2211 on the surface of the first conductive structure 210 is removed.

Figure 15:
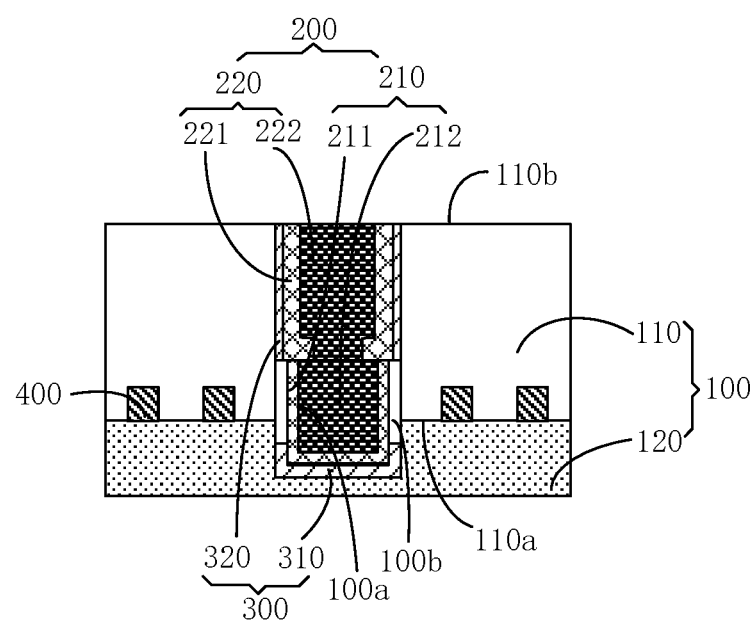
FIG. 15 is a third schematic diagram of semiconductor structures according to different embodiments.

At S3222, a second conductive layer 222 is formed on the surface of the second barrier layer 221 and the exposed surface of the first conductive structure 210, the second conductive layer 222 and the second barrier layer 221 forming a second conductive structure 220, referring to FIG. 14 or FIG. 15.

At S3221, the second barrier layer 221 covering the surface of the first conductive structure 210 may be completely removed or partially removed.

At S3222, the connecting hole is filled up by the second conductive layer 222. In addition, the second conductive layer 222 is connected with the second barrier layer 221 and the first conductive structure 210.

In this embodiment, the second conductive layer 222 and the first conductive structure 210 (mainly the first conductive layer 212 of the first conductive structure 210) are connected by contact with each other, so that the contact resistance between the second conductive structure 220 and the first conductive structure 210 is reduced.

Referring to FIG. 15, when the second barrier layer 221 covering the surface of the first conductive structure 210 is partially removed, the contact resistance can be reduced and the second conductive layer 222, and at the same time, the first conductive layer 212 that are separately formed can be prevented from being effected by thermal stress.

In addition, if the central part of the second barrier layer 221 covering the surface of the first conductive structure 210 is removed and the edge part is kept, the kept edge part can also help to avoid a poor contact at the connection position between the second barrier layer 221 and the first barrier layer 211, thus avoid influencing the inhibition effect on thermal expansion stress generated by the conductive layer structures (including the first conductive layer 212 and the second conductive layer 222) inside the second barrier layer 221 and the first barrier layer 211.

In the foregoing embodiment, the second barrier layer 221 is connected to the first barrier layer 211. Therefore, the second barrier layer 221 and the first barrier layer 211 can jointly produce an adequate inhibition effect on the thermal expansion stress of the conductive layer structures (including the first conductive layer 212 and the second conductive layer 222) inside the second barrier layer 221 and the first barrier layer 211.

Furthermore, the air gap 100b may be sealed by the second barrier layer 221, so that the second barrier layer 221 is in adequate contact with the first barrier layer 211.

In an embodiment, it is set that the thickness of the second barrier layer 221 is greater than that of the first barrier layer 211. In this case, it can be effectively avoided that the inhibition effect on the thermal expansion stress in the conductive layer structures (including the first conductive layer 212 and the second conductive layer 222) inside the second barrier layer 221 and the first barrier layer 211 is affected due to poor contact at the connection between the second barrier layer 221 and the first barrier layer 211.

Certainly, the thickness of the second barrier layer 221 may not be greater than the thickness of the first barrier layer 211. This is not limited in this disclosure.

Understandably, although various steps in the flowcharts of FIG. 1 to FIG. 3 are sequentially shown by arrows, the steps are not sequentially executed necessarily in the order indicated by the arrows. Unless expressly stated in the description, there are no strict sequence restrictions on the execution of these steps, and these steps may be executed in other orders. Moreover, at least part of steps in FIG. 1 to FIG. 3 may include a plurality of operations or a plurality of stages, which are not executed necessarily at the same time, and may be executed at different times; and are not sequentially executed necessarily, and may be executed in combination with other steps or at least part of operations or stages in other steps in turn or alternately.

In an embodiment, a semiconductor structure is further provided. Referring to FIG. 13 to FIG. 16, the semiconductor structure includes a base 100, a connecting hole 100a, a connecting structure 200, and an insulating structure 300.

The base 100 includes a substrate 110 and a dielectric layer 120. Herein the substrate 110 has a front surface 110a and a back surface 110b oppositely arranged, and the dielectric layer 120 is provided on the front surface 110a. The connecting hole 100a penetrates the substrate 110, and extends to the dielectric layer 120. The connecting structure 200 is located in the connecting hole 100a and spaced apart from the inner wall of the connecting hole 100a. The insulating structure 300 is located between the connecting structure 200 and the inner wall of the connecting hole 100a. The insulating structure 300, the inner wall of the connecting hole 100a, and the connecting structure 200 define an air gap 100b.

In this implementation, the insulating structure 300, the inner wall of the connecting hole 100a, and the connecting structure 200 define the air gap 100b. The air gap 100b has the insulating performance just as the insulating structure 300, so that the air gap 100b and the insulating structure 300 can together effectively implement electrical isolation between the connecting structure 200 and the substrate 110.

In addition, in this case, because the air gap 100b existing between the connecting structure 200 and the inner wall of the connecting hole 100a and air has a low thermal conductivity, this structure can effectively prevent heat generated by the connecting structure 200 from dissipating to semiconductor devices, the dielectric layer or the like around the connecting structure 200, thereby effectively improving heat dissipation performance.

In addition, in this case, the air gap 100b can also effectively isolate the connecting structure 200 from the substrate 110 and/or the dielectric layer 120 around the connecting structure 200, thereby effectively preventing the substrate 110 and/or the dielectric layer 120 from generating stress deformation due to thermal expansion of the connecting structure 200, to effectively avoid an interface cracking phenomenon in the substrate 110 and/or the dielectric layer 120.

In an embodiment, the air gap 100b penetrates the interface between the substrate 110 and the dielectric layer 120.

In an embodiment, the height of the part, corresponding to the dielectric layer 120, of the air gap 100b is less than that of the other part, corresponding to the substrate 110, of the air gap 100b.

In an embodiment, the connecting structure 200 includes a first conductive structure 210 and a second conductive structure 220 that are interconnected. The insulating structure 300 includes a first insulating layer 310 and a second insulating layer 320. The first insulating layer 310 is located between the inner wall of the connecting hole 100a and the first conductive structure 210. The second insulating layer 320 is located between the inner wall of the connecting hole 100a and the second conductive structure 220. The first insulating layer 310, the second insulating layer 320, the inner wall of the connecting hole 100a, and the connecting structure 200 define the air gap.

The second insulating layer 320 seals the air gap 100b (referring to FIG. 16), or the second insulating layer 320 and the second conductive structure 220 jointly seal the air gap 100b (referring to FIG. 13 to FIG. 15).

In an embodiment, the first conductive structure 210 includes a first barrier layer 211, which is connected to the first insulating layer 310. The second conductive structure 220 includes a second barrier layer 221, which is connected to the second insulating layer 320 and the first barrier layer 211.

In an embodiment, the thickness of the second barrier layer 221 is greater than that of the first barrier layer 211.

In an embodiment, referring to FIG. 13, the second conductive structure 220 further includes a second conductive layer 222 filling up the connecting hole 100a. The second conductive layer 222 is connected to the second barrier layer 221, and the second conductive layer 222 and the first conductive structure 210 are separated by the second barrier layer 221.

In an embodiment, referring to FIG. 14 or FIG. 15, the second conductive structure 220 further includes a second conductive layer 222 filling up the connecting hole 100a. The second conductive layer 222 is connected to the second barrier layer 221 and the first conductive structure 210.

In this case, the second barrier layer 221 may be not provided between the first conductive structure 210 and the second conductive layer 222, referring to FIG. 14; or a part of the second barrier layer 222 may be provided between the first conductive structure 210 and the second conductive layer 222. For example, the second barrier layer 221 may be further provided at the edge of the second conductive layer 222 and between the first conductive structure 210 and the second conductive layer 222, referring to FIG. 15.

For the specific limitations and technical effects of the semiconductor structure, reference may be made to the foregoing limitations of the method for forming a semiconductor structure. Details are not described herein again.

Certainly, it can be understood that the semiconductor structure in this disclosure is not limited to being formed by using the method for forming a semiconductor structure in the foregoing embodiments.

In an embodiment, a stacked structure is further provided. The stacked structure is formed by processing any of the foregoing semiconductor structures.

Specifically, during the formation of the stacked structure, the foregoing semiconductor structure requires processing processes such as etching and planarization to expose the connecting structure 200 (not shown) in the dielectric layer 120, so that when the semiconductor structure and an adjacent semiconductor structure are stacked, the connecting structures 200 in the connecting holes 100a can be conductively connected with each other, to perform signal transmission.

More specifically, in some embodiments, when the connecting structure 200 includes the first conductive structure 210 and the second conductive structure 220, the first conductive layer 212 of the first conductive structure 210 needs to be exposed to perform signal transmission.

In the description of the specification, the description with reference to terms "an embodiment", "desired embodiment", and the like indicate that specific features, structures, materials or features described with reference to the embodiment or example are included in at least one embodiment or example of this disclosure. In the specification, the schematic descriptions of the foregoing terms do not necessarily involve the same embodiments or examples.

The technical features in the foregoing embodiments may be randomly combined. For simplicity of description, not all possible combinations of the technical features in the foregoing embodiments have been described. However, it should be considered that these combinations of technical features fall within the scope recorded in the specification provided that these combinations of technical features do not have any conflict.

The foregoing embodiments only describe several embodiments of this disclosure, and their description is specific and detailed, but cannot therefore be understood as a limitation to the scope of the disclosure. It should be noted that for a person of ordinary skill in the art, several variations and improvements may further be made without departing from the concept of this disclosure. These variations and improvements should also be deemed as falling within the scope of protection of this disclosure. Therefore, the scope of protection of the patent of this disclosure shall be subject to the appended claims.

What is claimed is:

1. A semiconductor structure, comprising:
a base, comprising a substrate and a dielectric layer, wherein the substrate has a front surface and a back surface that are oppositely arranged, and the dielectric layer is located on the front surface;
a connecting hole, penetrating the back surface of the substrate and extending to the dielectric layer;
a connecting structure, located in the connecting hole; and
an insulating structure, located between the connecting structure and an inner wall of the connecting hole,
wherein the connecting structure comprises a first conductive structure and a second conductive structure that are interconnected, the insulating structure comprises a first insulating layer and a second insulating layer, the first insulating layer is located between the inner wall of the connecting hole and the first conductive structure, and a distance from a surface of the first conductive structure to the back surface of the substrate is greater than a distance from a surface of the first insulating layer to the back surface of the substrate, the second insulating layer is located between the inner wall of the connecting hole and the second conductive structure, and the first insulating layer, the second insulating layer, the inner wall of the connecting hole and the connecting structure define an air gap, and wherein the second insulating layer seals the air gap, or the second insulating layer and the second conductive structure jointly seal the air gap.

2. The semiconductor structure according to claim 1, wherein the air gap penetrates an interface between the substrate and the dielectric layer.

3. The semiconductor structure according to claim 2, wherein a height of a part of the air gap located in the dielectric layer is smaller than a height of a part of the air gap located in the substrate.

4. The semiconductor structure according to claim 1, wherein the first conductive structure comprises a first barrier layer, which is connected to the first insulating layer, and the second conductive structure comprises a second barrier layer, which is connected to the second insulating layer and the first barrier layer.

5. The semiconductor structure according to claim 4, wherein the second conductive structure further comprises a second conductive layer filling up the connecting hole, the second conductive layer is connected to the second barrier layer, the second conductive layer and the first conductive structure are separated by the second barrier layer.

6. The semiconductor structure according to claim 5, wherein a thickness of the second barrier layer is greater than a thickness of the first barrier layer.

7. The semiconductor structure according to claim 4, wherein the second conductive structure further comprises a second conductive layer filled in the connecting hole, and the second conductive layer is connected to the second barrier layer and the first conductive structure.

8. The semiconductor structure according to claim 7, wherein a thickness of the second barrier layer is greater than a thickness of the first barrier layer.

9. A stacked structure, formed by processing the semiconductor structure according to claim 1.

10. A method for forming a semiconductor structure, comprising:
providing a base comprising a substrate and a dielectric layer, wherein the substrate has a front surface and a back surface that are oppositely arranged, the dielectric layer is formed on the front surface;
forming a connecting hole in the base, wherein the connecting hole penetrates the back surface of the substrate and extends to the dielectric layer;
forming a connecting structure in the connecting hole; and
forming an insulating structure between the connecting structure and an inner wall of the connecting hole,
wherein forming the connecting structure in the connecting hole comprises:
forming a first conductive structure in the connecting hole, wherein the first conductive structure is spaced apart from the inner wall of the connecting hole, and a distance exists between a surface of the first conductive structure and an opening of the connecting hole;
forming the insulating structure between the connecting structure and the inner wall of the connecting hole comprises:

forming a first insulating layer between the inner wall of the connecting hole and the first conductive structure, wherein a distance between a surface of the first insulating layer and the opening of the connecting hole is greater than the distance between the surface of the first conductive structure and the opening of the connecting hole, and
forming a second insulating layer on the inner wall of the connecting hole, wherein the first insulating layer and the second insulating layer constitute the insulating structure, and the first insulating layer, the second insulating layer, the inner wall of the connecting hole and the connecting structure define an air gap; and
forming the connecting structure in the connecting hole further comprises:
forming a second conductive structure on a surface of the second insulating layer and the surface of the first conductive structure, wherein the first conductive structure and the second conductive structure constitute the connecting structure,
wherein the second insulating layer seals the air gap, or the second insulating layer and the second conductive structure jointly seal the air gap.

11. The method for forming a semiconductor structure according to claim 10, wherein
forming the connecting hole in the base comprises:
etching the base from the back surface of the substrate to form the connecting hole.

12. The method for forming a semiconductor structure according to claim 10, wherein the air gap penetrates an interface between the substrate and the dielectric layer.

13. The method for forming a semiconductor structure according to claim 12, wherein a height of a part of the air gap located in the dielectric layer is smaller than a height of a part of the air gap located in the substrate.

14. The method for forming a semiconductor structure according to claim 10, wherein forming the insulating structure between the connecting structure and the inner wall of the connecting hole further comprises:
forming a primary insulating layer on the inner wall of the connecting hole before the first conductive structure is formed in the connecting hole, wherein the primary insulating layer comprises a first side wall portion located on a side wall of the connecting hole;
forming the first conductive structure in the connecting hole comprises:
forming a primary barrier layer on a surface of the primary insulating layer;
forming a primary conductive layer on a surface of the primary barrier layer; and
removing part of the primary conductive layer and part of the primary barrier layer to expose part of the first side wall portion, wherein the remaining part of the primary barrier layer constitutes the first barrier layer, the remaining part of the primary conductive layer constitutes the first conductive layer, and the first barrier layer and the first conductive layer forming the first conductive structure,
forming the first insulating layer between the inner wall of the connecting hole and the first conductive structure comprises:
removing part of the primary insulating layer, wherein the remaining part of the primary insulating layer constitutes the first insulating layer.

15. The method for forming a semiconductor structure according to claim 14, wherein forming the second conductive structure on the surface of the second insulating layer and the surface of the first conductive structure comprises:
forming a second barrier base layer on the surface of the second insulating layer, a surface of the first barrier layer and a surface of the first conductive layer; and
forming a second conductive layer which is connected to the second barrier base layer.

16. The method for forming a semiconductor structure according to claim 15, wherein the second barrier base layer is as the second barrier layer, and forming the second conductive layer comprises:
forming the second conductive layer on a surface of the second barrier layer, wherein the second conductive layer and the second barrier layer constitutes the second conductive structure.

17. The method for forming a semiconductor structure according to claim 15, wherein forming the second conductive layer comprises:
removing at least part of the second barrier base layer on the surface of the first conductive structure, wherein the remaining part of the second barrier base layer constitutes the second barrier layer; and
forming a second conductive layer on a surface of the second barrier layer and an exposed surface of the first conductive structure, wherein the second conductive layer and the second barrier layer constitutes the second conductive structure.

18. The method for forming a semiconductor structure according to claim 17, wherein a thickness of the second barrier layer is greater than a thickness of the first barrier layer.

\* \* \* \* \*